United States Patent [19]

Ogawa et al.

[11] Patent Number: 4,828,931
[45] Date of Patent: May 9, 1989

[54] SUPERCONDUCTOR FOR MAGNETIC FIELD SHIELDING

[75] Inventors: Souichi Ogawa, Hyogo; Takao Sugioka; Masaru Inoue, both of Osaka, all of Japan

[73] Assignees: Osaka Prefecture; Koatsu Gas Kogyo Co., Ltd., both of Osaka, Japan

[21] Appl. No.: 169,369

[22] Filed: Mar. 17, 1988

[30] Foreign Application Priority Data

Mar. 23, 1987 [JP] Japan .................................. 62-68499

[51] Int. Cl.$^4$ ............................................. H05K 9/00
[52] U.S. Cl. ..................... 428/596; 428/613; 428/662; 428/137; 428/930; 174/35 MS
[58] Field of Search .............. 174/35 MS; 428/930, 428/662, 596, 613, 600, 626, 625, 615, 624, 636, 674, 651, 685, 680, 138, 635, 137

[56] References Cited

U.S. PATENT DOCUMENTS

| H39 | 3/1986 | Gubser et al. | 174/35 MS |
|---|---|---|---|
| 3,440,336 | 4/1969 | Boyner | 428/930 |
| 3,443,021 | 5/1969 | Schrader | 428/930 |
| 3,603,716 | 9/1971 | Koren et al. | 174/35 MS |
| 4,408,255 | 10/1983 | Adkins | 174/35 MS |
| 4,678,699 | 7/1987 | Kritchevsky et al. | 174/35 MS |

Primary Examiner—John J. Zimmerman
Attorney, Agent, or Firm—Koda and Androlia

[57] ABSTRACT

A superconductor for magnetic field shielding comprising a substrate, at least one superconductor film layer, which is laminated on the substrate, and a plurality of small holes 2 which pass through the substrate and the superconductor film layer, wherein the thickness of the superconductor film layer is 100 μm or less.

The superconductor of the present invention uses both superconductive shielding and electromagnetic shielding to deliver extremely high magnetic shielding performance.

10 Claims, 1 Drawing Sheet

SUPERCONDUCTOR FOR MAGNETIC FIELD SHIELDING

BACKGROUND OF THE INVENTION

1. Field of the Invention

The present invention relates to a superconductor for magnetic field shielding which shields magnetic fields using superconductors.

2. Prior Art

As a magnetic field shielding using superconductivity, the first class superconductor or the second class superconductor has been used depending on the intensity of a magnetic field. The superconductor for magnetic field shielding comprising the first class superconductor uses perfect diamagnetism (Meissner effect), a property of superconductivity. The superconductor cannot shield intense magnetic fields since its critical magnetic flux density is low. The superconductor for magnetic field shielding comprising the second class superconductor utilizes a mixture of the superconduction state and the normal conduction state, and its critical magnetic field is separated into the upper and lower critical magnetic fields. Since the intensity of the upper critical magnetic field is extremely high, the superconductor comprising the second class superconductor can be used to shield intense magnetic fields.

For magnetic field shielding using the second class superconductor, what is called "electromagnetic shielding" using the interlinkage magnetic flux unchangeability principle can also be used to shield intense magnetic fields When the above-mentioned superconductor is used to shield magnetic fields, thin films of superconductor layers are laminated. This kind of shielding can perform stable shielding for a relatively intense magnetic field in the thin region of the superconductor layers. If the intensity of the magnetic field is very high, that is, close to the intensity of the upper critical magnetic field of a superconductor, heat is generated by magnetic flux flow, and the shielding effect is completely lost (secondary harmful effects). If a shielding comprises a plurality of thick superconductor film layers (10 layers of approximately 20 μm thick films for example), the above-mentioned harmful effects may be caused even when the intensity of the magnetic field is relatively low. Accordingly, stability increases as the superconductor layer is thinner.

The applicant of the present invention provided a magnetic field shielding, which was a composite lamination comprising thin superconductor film layers and metal and having a high magnetic field shielding effect, as U.S. patent application Ser. No. 826,291, now abandoned, and European patent application Ser. No. 86101 613.7. These prior inventions are also characterized in that the superconductor layers are made thinner than those made by the conventional technology.

However, if such a superconductor is exposed in a magnetic field, the magnetic field enters the superconductor layers (there is a limit in this depth of entry, which is generally referred to as entry depth of magnetic flux and is approximately 500 Å.) If the thickness of the superconductor layer is smaller than this entry depth of magnetic flux, almost all the magnetic fluxes pass through the layer and shielding is impossible. If the intensity of the magnetic field exceeds that of the upper critical magnetic field, the property of superconduction is usually lost and normal conduction occurs.

In the case of the above-mentioned electromagnetic shielding, such a superconductor must be joined using solder, for example, to form a continuous conductor (a closed circuit where electric current can flow). Therefore, even when the conductor is made of superconductor material with no resistance, the joint section has a small resistance and thus the circuit has a certain resistance. This electromagnetic shielding can completely shield an intermittent magnetic filed, but it cannot fully shield a uniform magnetic field (magnetic field with a uniform intensity) since the shielding effect drops as time passes due to the above-mentioned resistance. This kind of electromagnetic shielding is used only to shield fluctuating magnetic field and thus has a very narrow application range. When electromagnetic shielding is used to shield a large area of field, a plurality of superconductor coils are used. In this case, the magnetic field leaks from the clearances between the superconductor coils and thus no high shielding effect is obtained. A net-like shielding can be devised by eliminating the clearances between the superconductor coils. However, producing this kind of shielding requires much labor to join superconductors in network. Furthermore, if it is necessary to shield a magnetic field with higher intensity, the network shielding needs to be laminated into multiple layers. The volume becomes relatively larger and the shielding support layer must also be made larger. This requires much more amount of refrigerant.

SUMMARY OF THE INVENTION

It is therefore an object of the present invention to provide a superconductor for magnetic field shielding mainly comprising the second class superconductor. After examining the above-mentioned problems, the inventors of the present invention succeeded in development of a superconductor for manetic field shielding with an extremely high shielding effect by fully utilizing the features of the above-mentioned superconductive shielding and electromagnetic shielding.

The present invention is detailed referring to the following drawings.

DETAILED DESCRIPTION OF THE INVENTION

Figure 1:
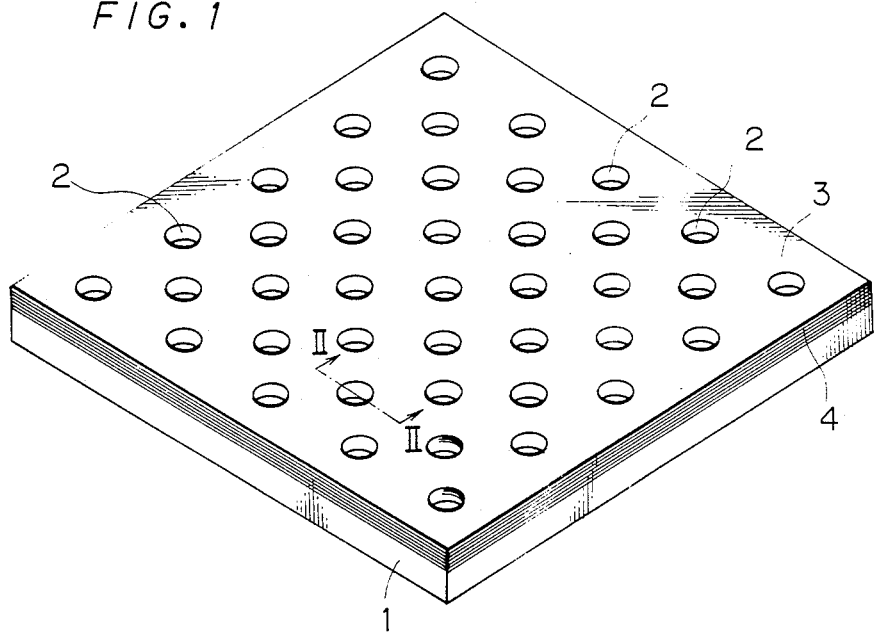
FIG. 1 is a perspective view illustrating an example of the superconductor for magnetic field shielding of the present invention.
Figure 2:
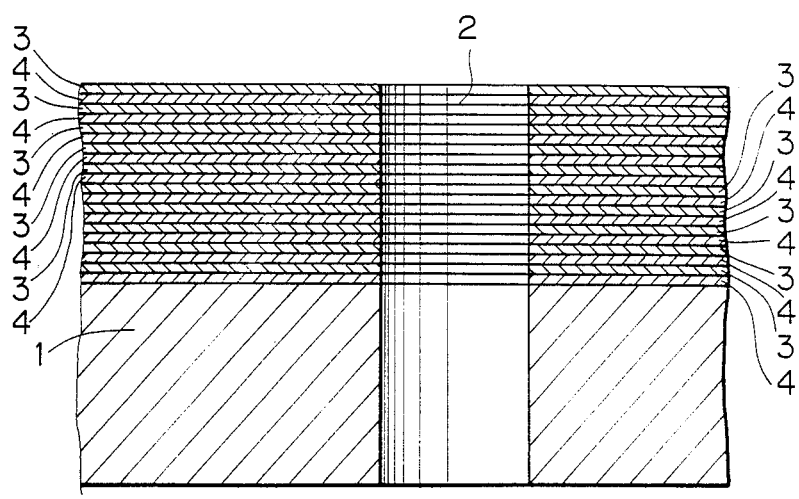
FIG. 2 is an enlarged vertical sectional view taken on line II—II of FIG. 1.

The present invention provides two basic embodiments. One embodiment has a single superconductor film layer and the other embodiment has a plurality of superconductor film layers. These are selected according to the ntensity of the magnetism to be shielded. Referring to FIGS. 1 and 2, the former embodiment is a superconductor for magnetic field shielding comprising a substrate 1, at least one superconductor film layer 3, which is laminated on the substrate 1, and a plurality of small holes 2 which pass through the substrate 1 and the superconductor film layer 3. The thickness of the superconductor film layer 3 is 100 μm or less.

The lamination shown in FIGS. 1 and 2 is detailed below in the description of Examples 4 to 7.

Metal, such as copper, aluminum, nickel or stainless steel, or organic high molecular material, such as polyester, polyphenylene sulfide, vinylidene chloride, polyimide or polyether sulfone is used for the substrate 1. The substrate has a plurality of small holes 2. The area of one small hole 2 should be 3 cm² or less. The areal porosity in the entire area of the substrate 1 should be 90% or less.

The small hole 2 can have a shape of circle, square or many other shapes. Superconductor material, such as niobium, niobium compound, niobium alloy, vanadium compound or vanadium alloy is used for the above-mentioned superconductor film layer 3. More specifically, Nb, Nb—Ti alloy, Nb—Zr alloy, NbN, NbC, $Nb_3Sn$, $Nb_3Al$, $Nb_2Ga$, $Nb_3Ge$, $Nb_3AlGe$ or $V_3Ga$ is used. In addition, ceramic-based perovskite superconductor material (for example Ba—Y—Cu—O compound and La—Sr—Cu—O compound) and Chevrel superconductor material (for example $PbMo_6S_8$) are also used. These come under the category of the second class superconductor and has the above-mentioned characteristics. The kind of material should be determined depending on the intensity of the magnetic field to be shielded. In actual practice, however, Nb—Ti alloy is the best suited.

The latter comprises the substrate 1, a plurality of superconductor film layers 3 and metal layers 4 (these layers are laminated alternately on the substrate 1) and a plurality of small holes 2 passing through the lamination. The thickness of the superconductor film layer 3 is 100 μm or less and the top layer of the laminated material is the superconductor film layer 3. High-purity aluminum and copper are ideally suited for the metal film layer 4 sandwiched between the superconductor film layers. Silver is also suited. These metals of low purity or other metals can also be used. The superconductor film layers 3 and the metal film layers 4 are usually made by sputtering or electron beam evaporation sequentially. The area of the small hole 2 should be 3 cm² (preferably 1 μm² to 0.75 cm²). The open area rate of the substrate 1 to the small holes should be 90% or less. If the area or rate is larger, the lamination has less strength and is adversely affected when it is subjected to stress caused by an intense magnetic field or when it is handled. If the area is too small, clogging is apt to occur during evaporation, and the area of the superconductor film layers 3 becomes small. As a result, the shielding current required to shield an intense magnetic field (current flows to generate the magnetic field which cancels the environmental magnetic field) becomes small. If the open area of the small hole 2 exceeds 3 cm², an inclination occurs at the shielding magnetic field in each small hole 2. Complete shielding cannot be conducted at each hole. If the superconductor film layers 3 exceeds 100 μm, stable shielding cannot be obtained when excitation is quick. In this respect, the effect is more stable as the superconductor film layers 3 is thinner.

In the above-mentioned superconductor for magnetic field shielding, electromagnetic shielding is performed at the small hole sections and superconductive shielding is performed at the other sections using complete diamagnetism and mixed-condition diamagnetism. These two shielding effects are taken synergistically and extremely high magnetism shielding can be performed. In the case of electromagnetic shielding, shielding current flows in the closed circuit composed of a superconductor to cancel the magnetic field to be shielded by generating the magnetic field whose force direction is opposite to that of the magnetic field to be shielded. As the critical current density of the superconductor increases, intense magnetic field can be shielded more efficiently and stably.

By making the superconductor film layer 3 thinner, the intensity of the upper critical magnetic field and critical current density of the layer become larger than those of the bulk of the similar kind. Therefore, the shielding of the present invention devised by combining the above-mentioned two shielding methods can be used to shield extremely intense magnetic fields. Accordingly, a relatively smaller amount of superconductor material is required to shield the magnetic field of the desired intensity.

Unlike the above-mentioned network shielding, the magnetic shielding of the present invention has no joining section, or soldering section to form closed circuits. When the magnetic shielding is used at a temperature below the critical temperature, the entire resistance of the closed circuit (circumference of the small hole) to be shielded becomes zero. Complete shielding is thus possible regardless of whether the magnetic field to be shielded is uniform or variable. The superconductor for magnetic field shielding of the present invention has limitless applications.

Furthermore, unlike a magnetic shielding sheet which has not any small holes such as small holes 2 in the substrate 1 of the present invention, refrigerant can enter the interiors of the small holes and the entire area can be fully cooled. In a magnetic field of a high intensity, magnetic fluxes can be forcibly trapped at the small hole sections to prevent heat generation due to magnetic flux flow. Therefore, extremely stable effect is obtained even in a magnetic field of a high intensity.

As described above, as the superconductor film layer 3 becomes thinner, the effect is stabler. Even if the thickness of the superconductor film layer 3 of the present invention is made smaller than the entry depth of magnetic flux, the superconductor for magnetic field shielding of the present invention can shield a magnetic field whose intensity is higher than that of the upper critical magnetic field of the bulk of the similar kind due to the following reasons. Since the entry depth of magnetic flux is larger than the coherence length (depth from the superconductor surface where superconductor electrons can exist) in the case of the second class superconductor, the electric resistance remains zero even when the thickness of the film layer is smaller than the entry depth of the magnetic field. The intensity of the upper critical magnetic field for the shielding of the present invention is considerably higher than that for the bulk of the similar kind.

When the thickness of the above-mentioned conventional superconductor for magnetic field shielding made of thin film lamination is made smaller than the entry depth of magnetic flux to obtain a stable effect, the most part of the magnetic field passes through the superconductor regardless of the intensity of the magnetic field and the number of superconductor layers, and shielding is impossible. The superconductor for magnetic field shielding of the present invention performs electromagnetic shielding. Even when the thickness of the superconductor film layer is smaller than the entry depth of magnetic flux, shielding current flows due to zero resistance of the superconductor layers and the magnetic shielding effect is thus not lost.

When a plurality of superconductor film layers are used for the superconductor for magnetic field shielding of the present invention, the metal film layer 4, made of Cu, Al or Ag, is sandwiched between the superconductor film layers 3. The metal film layer 4 is useful to stabilize (mainly cool) the superconductor film layers 3. More particularly, the heat conductivity of the superconductor film layers 3 is very high and the all superconductor film layers 3 can have higher heat radiation effect. Temperature rise due to magnetic flux flow is prevented. Current branches are formed at portions where the superconduction state is converted into the normal conduction state to prevent heat generation and to restore the superconduction state. When a plurality of superconductor layers are exposed to an intense magnetic field, the first layer is affected most seriously by the magnetic field. The second and the subsequent layers are less affected. The intensity of the magnetic field becomes nearly zero at the final layer. This shielding function is possible only when all layers operate stably. If a flux jumping occurs at the first layer for example, an abrupt magnetic field change occurs at the second layer, and a flux jumping also occurs at the second layer, resulting in that the desired magnetic field shielding effect cannot be obtained.

Since the superconductor for magnetic field shielding of the present invention is a composite lamination of metal layers 4 having the above-mentioned function sandwiched between the superconductor film layers 3 and the small holes 2 are disposed to forcibly prevent magnetic flux flow, the above-mentioned flux jumping is prevented and the superconductor layers 3 are stabilized. Thus, the characteristics of the superconductor layers can be fully utilized.

Embodiment examples and comparison examples are described below.

(a) Three polyphenylene sulfide sheets having a thickness of 50 $\mu$m were prepared. These were used as substrates 1. Small square holes 2 (with a side 3 mm long) were disposed in each substrate 1 so that the areal porosity of the substrate were 30%, 80% and 91%, respectively.

A 10 $\mu$m thick film of Nb—Ti alloy was produced on one side of each substrate 1 by sputtering method without applying heat to form a superconductor film layer 3 made of Ni—Ti alloy. In this way, three types of composite laminations were formed and classified as embodiment example 1, embodiment example 2 and comparison example 1 (areal porosity of 30%, 80% and 91% respectively).

Each of the above-mentioned composite laminations was processed to take a shape of a disc of 45 mm in diameter. The amount of magnetic field shielding was measured at the center of each disc. The amounts were 0.052, 0.012 and 0.000 Teslas for embodiment example 1, embodiment example 2 and comparison example 1 respectively. Accordingly, if the areal porosity exceeds 90%, the shielding effect is almost lost, and such a shielding lamination has less strength and is adversely affected when it is subjected to stress caused by a magnetic field or when it is handled.

(b) Two 30 $\mu$m thick Ni sheets were prepared. These were used as substrates 1. Small holes 2 of 30 $\mu$m in diameter were disposed in the substrates so that the areal porosity of each substrate was approx. 5%. In the same way as the above item (a), a 10 $\mu$m thick film of Nb—Ti alloy was produced on one side of each substrate 1 to form a superconductor film layer 3 made of Ni—Ti alloy. In this way, two types of composite laminations were obtained and classified as embodiment example 3 and comparison example 2 (with no small holes).

The magnetic field shielding amount for embodiment example 3 was 0.089 Teslas and that for comparison example was 0.072 Teslas. It is understood that the composite lamination with no small holes has less magnetic field shielding effect.

(c) Five 30 $\mu$m Ni sheets were prepared and these were used as substrates 1. Small holes 2 of approx. 50 $\mu$m in diameter were disposed in the substrates 1 so that the areal porosity of the substrates was approx. 5%. Using the same sputtering method as described above, 10 superconductor film layers 3 (made of Nb—Ti alloy) and 10 metal film layers 4 (made of 99.99% Cu) were formed alternately one by one to obtain the following five kinds of composite laminations. In this case, the thickness of the metal film layer 4 is a constant value of 2 $\mu$m. The thicknesses of the superconductor film layers 3 of the five types of composite laminations were 1 $\mu$m, 10 $\mu$m, 30 $\mu$m and 100 $\mu$m respectively. These were classified as embodiment examples 4, 5, 6 and 7, and comparison example 3. FIGS. 1 and 2 show an example of these composite laminations.

In the figures, the metal film layer 4 just above the substrate 1 can be omitted. Each metal film layer 4 should only be sandwiched between the superconductor film layers 3. The number of the lamination layers shown in FIG. 1 differs from that of the layers shdwn in FIG. 2 since some layers are not shown in FIG. 1 for convenience.

The magnetic field shielding amounts for these composite laminations were measured in the same way as described above. The amount for embodiment example 4 was 0.20 Teslas, that for embodiment example 5 was 0.88 Teslas, that for embodiment example 6 was 0.98 Teslas, that for embodiment example 7 was 1.1 Teslas and that for comparison example 3 was 0.75 Teslas.

According to these results, in the superconductor for magnetic field shielding laminated as described above, the stabilization effect increases and the shielding effect corresponding to the amount of superconductor material also increases as the superconductor film layer 3 is thinner. In the case of the lamination of 150 $\mu$m superconductor film layers such as those used for comparison example 3, the magnetic field shielding amount is relatively high, but the shielding effect becomes unstable sometimes. If excitation is quick, magnetic flux jumping may occur, bringing poor shielding effect. This causes problems when such a lamination is put in practical use.

(d) A 50 $\mu$m thick copper sheet was used as the substrate 1. Small holes 2 of 3 mm in diameter were disposed so that the areal porosity of the substrate 1 was 40%. One hundred superconductor film layers 3 made of NbC compound (the bulk's upper critical magnetic field of 1.69 Teslas) and 100 metal film layers 4 made of 99.99% aluminum were laminated alternately one by one the substrate 1 by responsive sputtering method while the substrate 1 was heated in the atmosphere of methane-argon mixture gas. The composite lamination obtained in this way was classified as embodiment example 8. The thickness of the superconductor film layer 3 of this embodiment example was 400 Å and the thickness of the metal film layer 4 was 1000 Å. Forty composite laminations of embodiment example 8 was exposed to the magnetic field intensity of 1.8 Teslas. The measured magnetic field shielding amount was approx. 0.3 Teslas.

As a result, it is understood that even the magnetic field stronger than the bulk's upper critical magnetic field can be shielded using the above-mentioned extremely thin superconductor film layers 3. This is explained as follows. When the superconductor film layer 3 is thinner than the entry depth of a magnetic flux, the intensity of the upper critical magnetic field increases and a closed circuit is formed around each small hole 2. The normal superconductive shielding and electromagnetic shielding are thus performed simultaneously. By laminating a plurality of layers, more complete shielding is possible. The stabilization effect is superior since the superconductor film layers 3 are very thin.

Instead of Nb—Ti alloy or NbC compound used as the above-mentioned superconductor film layers, other superconductor materials can function as described above although there are differences in the actual measurement values. This has been confirmed by the experiments conducted by the inventors of the present invention. However, the function of the superconductor material of embodiment example 8 with an extremely intense upper critical magnetic field is not yet confirmed since the magnetic field to be used for confirmation cannot be generated by the currently available technology. Nevertheless, it is easily known by analogy that superconductors other than NbC can function as described above. It is expected that the magnetic field shielding effect will increase in the magnetic field having the intensity higher than that of the upper critical magnetic field by sandwiching a dielectric film layer (instead of or together with the metal film layer) between the superconductor layers.

As described above, in the superconductor for magnetic field shielding of the present invention, shielding by diamagnetism of superconductor and electromagnetic shielding due to the closed circuits formed at the small hole sections are performed simultaneously, resulting in delivering an extremely high shielding effect regardless of whether the magnetic field is uniform or variable. In addition, the above-mentioned magnetic field shielding characteristics, the small hole sections and the metal film layers between the superconductor film layers function synergistically so that the superconductor can be extremely stable even in an intense magnetic field. Therefore, the superconductor of the present invention is regarded as a completely innovative superconductor for magnetic field shielding. If this invention is applied to various magnetic field shielding devices, it is obvious that the superconductor of the present invention is useful for reduction of the weight and cost of such devices, and stabilization of the devices. Furthermore, the superconductor of the present invention can be formed more easily since it is made of thin films. It is certain that the superconductor of the present invention will be highly evaluated in many fields as a superconductor for magnetic field shielding of very high practical use.

We claim:

1. A superconductor for magnetic field shielding comprising a substrate, at least one superconductor film layer, which is laminated on said substrate, and a plurality of small holes which pass through said substrate and said superconductor film layer, wherein the thickness of said superconductor film layer is 100 $\mu$m or less.

2. A superconductor for magnetic field shielding comprising a substrate, a plurality of superconductor film layers and metal layers laminated alternately on said substrate, and a plurality of small holes passing through the lamination, wherein the thickness of said superconductor film layer is 100 $\mu$m or less and the top layer of said lamination is said superconductor film layer.

3. A superconductor for magnetic field shielding according to claim 1, wherein superconductor material is deposited on said substrate having a plurality of small through holes by a sputtering method or electron beam evaporation method so as to form said at least one superconductor film layer on said substrate surface except for said small hole sections.

4. A superconductor for magnetic field shielding according to claim 2, wherein superconductor material is deposited on said substrate having a plurality of small through holes by a sputtering method or electron beam evaporation method so as to form said plurality of superconductor film layers on said substrate surface except for said small hole sections.

5. A superconductor for magnetic field shielding according to claim 3, wherein metal material is deposited on one of said superconductor film layer and/or said substrate by a sputtering method or electron beam evaporation method so that each of said metal film layers is formed sandwiched between two of said superconductor film layers or between said substrate and said superconductor film layer.

6. A superconductor for magnetic field shielding according to claim 4, wherein metal material is deposited on one of said superconductor film layer and/or said substrate by a sputtering method or electron beam evaporation method so that each of said metal film layers is formed sandwiched between two said superconductor film layers or between said substrate and said superconductor film layer.

7. A superconductor for magnetic field shielding according to claim 1, 2, 3, 4, 5 or 6 wherein the area of said small hole is 3 cm$^2$ or less and the open area rate of the entire area of said substrate to said small holes is 90% or less.

8. A superconductor for magnetic field shielding according to claim 1, 2, 3, 4, 5 or 6 wherein said substrate is made of copper, aluminum, nickel, stainless steel, or organic high molecular material selected from the group consisting of polyester, polyphenylene sulfide, vinylidene chloride, polyimide or polyether sulfone.

9. A superconductor for magnetic field shielding according to claim 1, 2, 3, 4, 5, or 6, wherein said superconductor film layer is made of niobium, niobium compound, niobium alloy, vanadium compound or vanadium alloy.

10. A superconductor for magnetic field shielding according to claim 2, 4, 5, or 6, wherein said metal film layer is made of copper, aluminum or silver.

* * * * *